(12) United States Patent
Kato

(10) Patent No.: US 12,410,505 B2
(45) Date of Patent: Sep. 9, 2025

(54) COATING FILM, TOOL, AND MACHINE TOOL

(71) Applicant: NIDEC MACHINE TOOL CORPORATION, Shiga (JP)

(72) Inventor: Takuma Kato, Shiga (JP)

(73) Assignee: NIDEC MACHINE TOOL CORPORATION, Shiga (JP)

( * ) Notice: Subject to any disclaimer, the term of this patent is extended or adjusted under 35 U.S.C. 154(b) by 231 days.

(21) Appl. No.: 18/177,089

(22) Filed: Mar. 1, 2023

(65) Prior Publication Data

US 2023/0279535 A1 Sep. 7, 2023

(30) Foreign Application Priority Data

Mar. 2, 2022 (JP) .................. 2022-031561

(51) Int. Cl.
C23C 14/02 (2006.01)
C23C 14/06 (2006.01)
C23C 14/08 (2006.01)
C23C 14/50 (2006.01)
B23F 21/10 (2006.01)
B23F 21/16 (2006.01)

(52) U.S. Cl.
CPC ........ C23C 14/024 (2013.01); C23C 14/0635 (2013.01); C23C 14/0641 (2013.01); C23C 14/0664 (2013.01); C23C 14/08 (2013.01); C23C 14/505 (2013.01); B23F 21/10 (2013.01); B23F 21/16 (2013.01)

(58) Field of Classification Search
CPC ... C23C 14/024; C23C 14/06; C23C 14/0635; C23C 14/0641; C23C 14/0647; C23C 14/0652; C23C 14/0664; C23C 14/08; C23C 14/083
See application file for complete search history.

(56) References Cited

FOREIGN PATENT DOCUMENTS

| CN | 102851642 | | 1/2013 |
|---|---|---|---|
| CN | 103898445 | | 7/2014 |
| JP | H1025566 | | 1/1998 |
| JP | 2003321764 | | 11/2003 |
| JP | 2013032578 | | 2/2013 |
| JP | 2017159423 | A * | 9/2017 |
| JP | 2017159424 | | 9/2017 |
| JP | 2020131425 | A * | 8/2020 |
| WO | 2013156131 | | 10/2013 |

OTHER PUBLICATIONS

JP 2020-131425 Machine Translation (Year: 2020).*
JP 2017-159423 Machine Translation (Year: 2017).*

* cited by examiner

Primary Examiner — Zachary M Davis
(74) Attorney, Agent, or Firm — JCIPRNET

(57) ABSTRACT

A coating film has a lamination unit including a first layer and at least one of a second layer and a third layer. The first layer is a nitride or the like of a first material represented by $(Cr_{1-a-b-c}Al_a[Ni_{1-d}Zr_d]_bX_c)$. X is at least one element selected from Ti, Nb, Si, B, W, and V. a, b, c, and d represent atomic concentrations. The second layer is a nitride or the like of the second material represented by $(Al_eCr_{1-e-f}Z_f)$. Z is at least one element selected from Si, Y, and B. e and f represent atomic concentrations. The third layer is a nitride or the like of the third material represented by $(Al_gCr_{1-g})$.

12 Claims, 10 Drawing Sheets

COATING FILM, TOOL, AND MACHINE TOOL

CROSS-REFERENCE TO RELATED APPLICATIONS

The present invention claims priority under 35 U.S.C. § 119 to Japanese Patent Application No. 2022-031561 filed on Mar. 2, 2022, the entire content of which is incorporated herein by reference.

FIELD OF THE INVENTION

The present disclosure relates to a coating film, a tool, and a machine tool.

BACKGROUND

Conventionally, a machine tool that cuts a part such as a gear is known. A machine tool cuts a part by bringing a tool such as a hob cutter, a pinion cutter, a skiving cutter, or a shaving cutter into contact with a surface of the part. This type of tool has a base material and a coating film covering the surface of the base material. For example, an Al—Cr—N-based hard coating film is used for the coating film.

Since the cutting tool cuts a metal part, the coating film on the surface is required to have very high hardness. However, since a material having high hardness has low toughness, there is a problem that cracks and wear are likely to occur. For this reason, it has been conventionally difficult to use a material having high hardness and to realize a coating film having high abrasion resistance.

SUMMARY

A coating film according to an exemplary embodiment of the present disclosure includes a lamination unit including a first layer and at least one of a second layer and a third layer. The first layer contains a nitride, a carbide, a carbonitride, or an oxide of a first material of which elemental composition is represented by $(Cr_{1-a-b-c}Al_a[Ni_{1-d}Zr_d]_bX_c)$. The $[Ni_{1-d}Zr_d]$ is a ZrNi compound. The X is at least one element selected from Ti, Nb, Si, B, W, and V. The a, b, and c respectively represent atomic concentrations of Al, [NiZr], and X in the $(Cr_{1-a-b-c}Al_a[Ni_{1-d}Zr_d]_bX_c)$, and satisfy $0.5 \le a \le 0.8$, $0.01 \le b \le 0.35$, and $0 \le c \le 0.2$. The d represents an atomic concentration of Zr in the $[Ni_{1-d}Zr_d]$, and satisfies $0.2 \le d \le 0.5$. The second layer contains a nitride, a carbide, a carbonitride, or an oxide of a second material of which elemental composition is represented by $(Al_cCr_{1-e-f}Z_f)$. The Z is at least one element selected from Si, Y, and B. The e and f represent atom concentrations of Al and Z in the $(Al_cCr_{1-e-f}Z_f)$, respectively, and satisfy $0.5 \le e \le 0.8$, $0.03 \le f \le 0.3$, $e+f \le 0.9$. The third layer contains a nitride, a carbide, a carbonitride, or an oxide of a third material of which elemental composition is represented by $(Al_gCr_{1-g})$. The g represents an atomic concentration of Al in the $(Al_gCr_{1-g})$, and satisfies $0.5 \le g \le 0.8$.

The above and other elements, features, steps, characteristics and advantages of the present disclosure will become more apparent from the following detailed description of the preferred embodiments with reference to the attached drawings.

DETAILED DESCRIPTION

Figure 1:
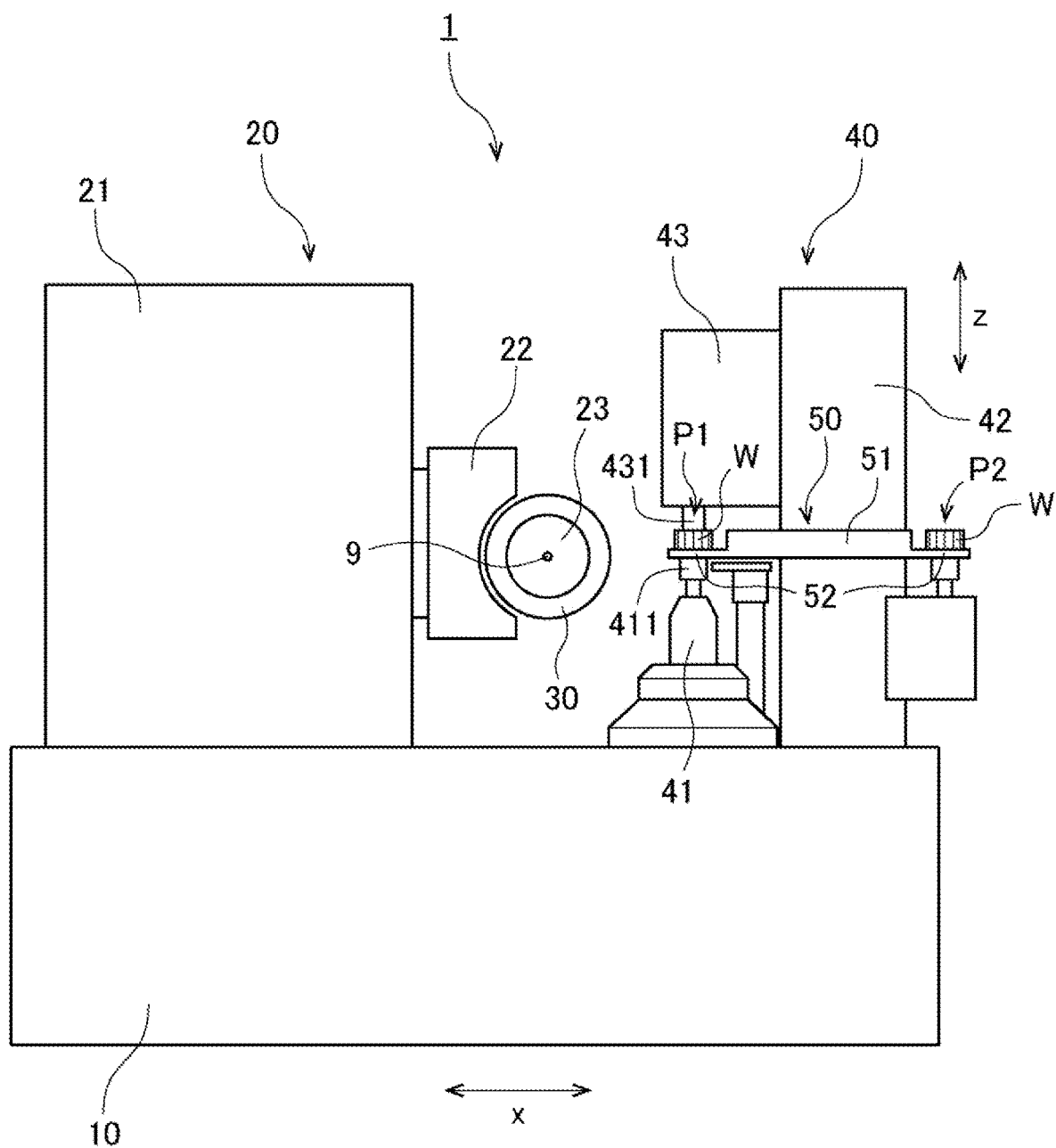
FIG. 1 is a side view of a machine tool.
Figure 2:
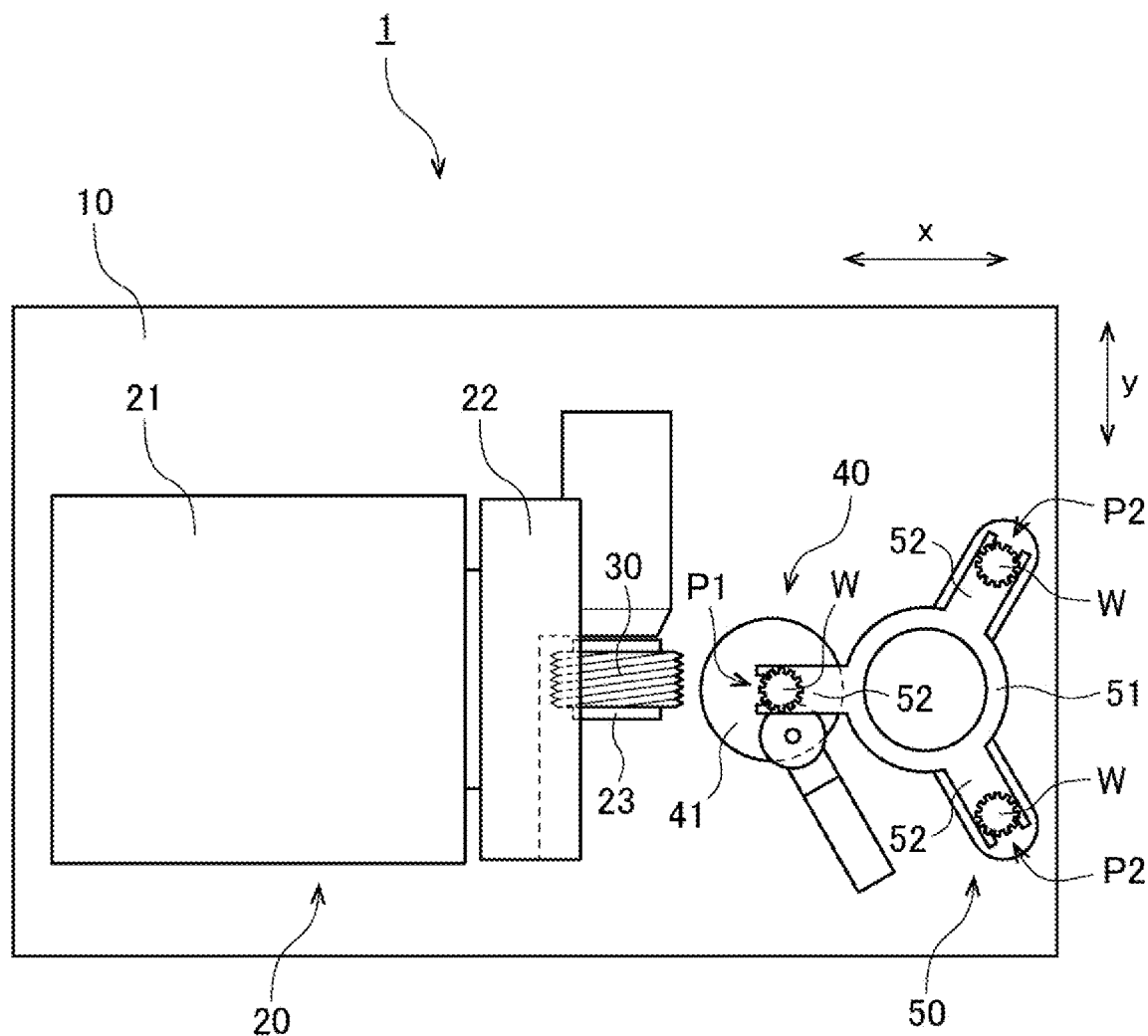
FIG. 2 is a plan view of the machine tool.

FIG. 1 is a side view of a machine tool 1 according to an embodiment. FIG. 2 is a plan view of the machine tool 1. FIGS. 1 and 2 illustrate an x direction, a y direction, and a z direction. In the present embodiment, the x direction and the y direction are horizontal directions and directions orthogonal to each other. In the present embodiment, the z direction is a vertical direction. However, the definitions of the x direction, the y direction, and the z direction do not limit the posture of the machine tool 1. That is, the x direction and the y direction may be directions other than the horizontal direction. Further, the z direction may be a direction other than the vertical direction.

The machine tool 1 is a device that manufactures a gear by cutting a metal part W with a tool 30. The machine tool 1 of the present embodiment is a so-called hob board using a hob cutter as the tool 30. As illustrated in FIG. 1, the machine tool 1 includes a bed 10, a tool holder 20, a tool 30, a part holder 40, and a part changer 50.

The bed 10 is a support base that supports the tool holder 20 and the part holder 40. The bed 10 is formed of rolled steel having high rigidity. The bed 10 is installed on a floor surface of a factory that manufactures gears. In FIG. 1, the bed 10 has a flat plate shape, and the tool holder 20 and the part holder 40 are supported on an upper surface of the bed. However, the bed 10 may have a housing shape having a bottom plate portion, a side wall portion, and a top plate portion, and the tool holder 20 and the part holder 40 may be accommodated in the housing shape. The tool holder 20 and the part holder 40 are arranged side by side in the x direction.

The tool holder 20 is a mechanism that holds the tool 30. As illustrated in FIGS. 1 and 2, the tool holder 20 includes a column 21, a saddle 22, and a tool head 23.

The column 21 is movable in the x direction with respect to the bed 10 by a first drive mechanism (not illustrated). The saddle 22 is provided on a surface of the column 21 facing the part holder 40. The saddle 22 is movable in the z direction with respect to the column 21 by a second drive mechanism (not illustrated).

The tool head 23 is attached to the saddle 22. The tool head 23 is movable in the y direction with respect to the saddle 22 by a third drive mechanism (not illustrated). The tool head 23 is rotatable about a rotation axis 9 extending in the y direction by a fourth drive mechanism (not illustrated).

The tool 30 is a component for machining the part W. The tool 30 is detachable from the tool head 23. When the first drive mechanism, the second drive mechanism, and the third drive mechanism described above are operated with the tool 30 attached to the tool head 23, the tool 30 moves in the x direction, the y direction, and the z direction together with the tool head 23. When the above-described fourth drive mechanism is operated with the tool 30 attached to the tool head 23, the tool 30 rotates at a high speed about the rotation axis 9 extending in the y direction.

Figure 3:
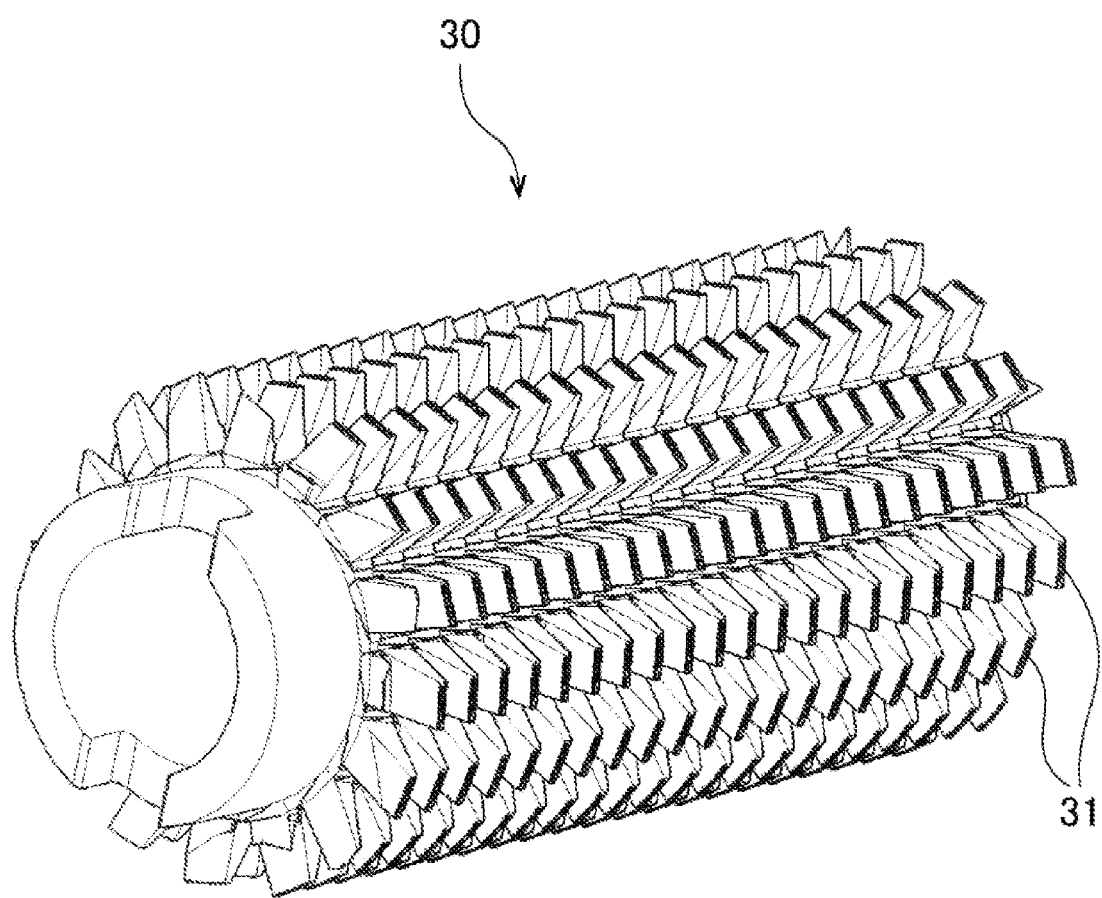
FIG. 3 is a perspective view of a tool.

FIG. 3 is a perspective view of the tool 30. The tool 30 of the present embodiment is a hob cutter for cutting external teeth of a gear. The tool 30 has a substantially cylindrical shape, and has a large number of cutting blades 31 arranged in a spiral shape on an outer peripheral surface thereof. In a state where the tool 30 is attached to the tool head 23, the rotation axis 9 of the tool head 23 and the central axis of the tool 30 are coaxially arranged.

The part holder 40 is a mechanism that supports the part W, which is a part. The part holder 40 is disposed spaced apart from the tool holder 20 in the x direction. As illustrated in FIG. 1, the part holder 40 includes a table 41, a counter column 42, and a tailstock 43. In FIG. 2, illustration of the counter column 42 and the tailstock 43 is omitted.

The table 41 is a unit that supports the part W from below. The table 41 is disposed between the column 21 and the counter column 42. A lower damper 411 that supports the part W from below is provided at the upper end of the table 41.

The counter column 42 is fixed to the upper surface of the bed 10. The counter column 42 extends upward from the upper surface of the bed 10. The tailstock 43 is a unit that supports the part W from above. The tailstock 43 is provided on a surface of the counter column 42 facing the tool holder 20 so as to be vertically movable. An upper damper 431 that supports the part W from above is provided at a lower end of the tailstock 43.

The part W is held in a sandwiched state between the lower damper 411 of the table 41 and the upper damper 431 of the tailstock 43. The lower damper 411 and the upper damper 431 are rotatable about a rotation axis extending in the z direction by a rotation mechanism (not illustrated). Therefore, the part W can be rotated by operating the rotation mechanism in a state where the part W is held by the lower clamper 411 and the upper damper 431.

The part changer 50 is a mechanism that conveys the part W. As illustrated in FIGS. 1 and 2, the part changer 50 includes a turntable 51. The turntable 51 has a plurality of arms 52. The part W is held at the distal end of each arm 52 via a gripper. The turntable 51 rotates about a rotation axis extending in the z direction by a rotation mechanism (not illustrated) while holding the part W in each arm 52. As a result, the part W can be conveyed between a machining position P1 between the table 41 and the tailstock 43 and a standby position P2 laterally away from the machining position P1.

In the example of FIG. 2, the turntable 51 includes three arms 52. However, the number of arms 52 of the turntable 51 may be 1, 2, or 4 or more.

When the part W is machined by the machine tool 1, first, the part changer 50 brings the part W into the machining position P1 from the standby position P2. Then, the part W is held by the lower clamper 411 and the upper damper 431. Next, the rotation of the part W about the rotation axis extending in the z direction is started by the above-described rotation mechanism, and the rotation of the tool 30 about the rotation axis extending in the y direction is started by the above-described fourth drive mechanism.

Subsequently, the tool 30 is brought close to the part W by the above-described first drive mechanism. Then, while rotating the part W and the tool 30, the position of the tool 30 with respect to the part W is gradually changed. As a result, external teeth are formed on the outer peripheral surface of the part W. Thereafter, the holding of the part W by the lower clamper 411 and the upper damper 431 is released, and the part W is unloaded from the machining position P1 to the standby position P2 by the part changer 50.

As described above, the machine tool 1 includes the part holder 40 and the tool 30 that machines the part W held by the part holder 40. As described later, the tool 30 has a coating film 33 having high abrasion resistance. Therefore, the machine tool 1 can accurately machine the part W over a long period of time using the tool 30.

Figure 4:
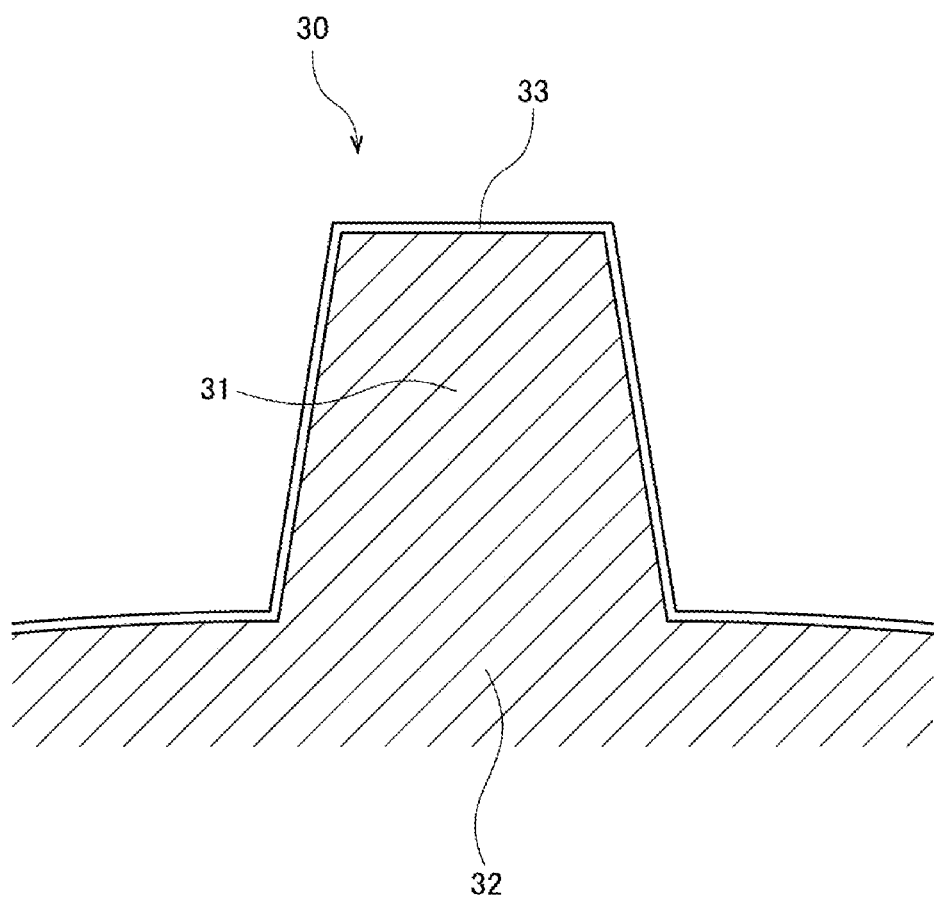
FIG. 4 is a cross-sectional view of the vicinity of a cutting edge of the tool.

FIG. 4 is a cross-sectional view of the vicinity of the cutting blade 31 of the tool 30. As illustrated in FIG. 4, the tool 30 includes a base material 32 formed of an alloy such as high speed steel or cemented carbide, and a hard coating film 33 covering the surface of the base material 32. Hereinafter, a first embodiment, a second embodiment, a third embodiment, and a fourth embodiment of the coating film 33 will be described.

Figure 5:
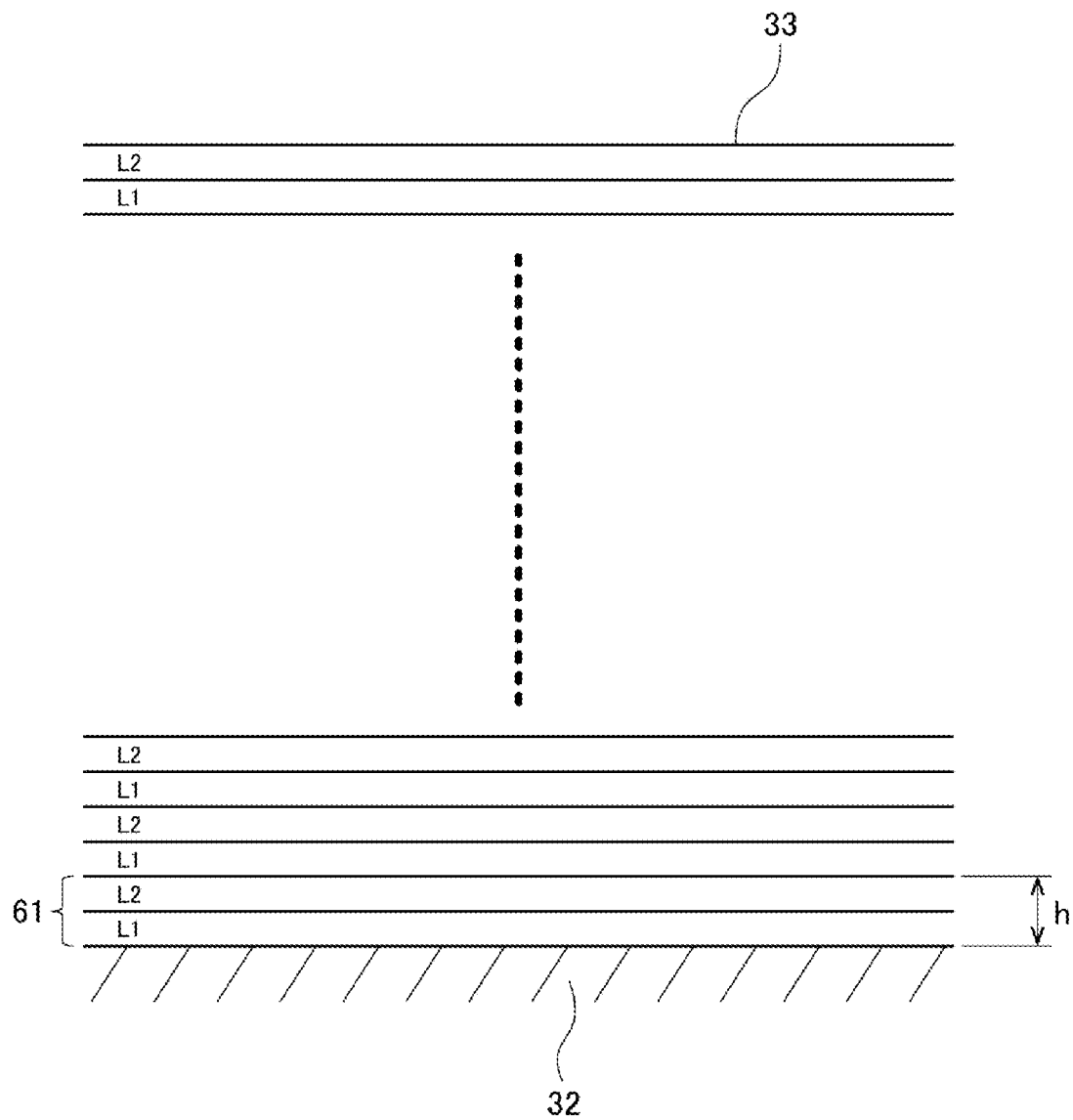
FIG. 5 is a diagram schematically illustrating a layer structure of a coating film according to a first embodiment.

FIG. 5 is a diagram schematically illustrating a layer structure of the coating film 33 according to the first embodiment. As illustrated in FIG. 5, the coating film 33 of the first embodiment is a multilayer film in which a plurality of lamination units 61 each including as a first layer L1 and a second layer L2 are stacked. The thickness of the coating film 33 is, for example, about 1 μm to 5 μm. As described later, by repeatedly laminating the lamination unit 61 a plurality of times, the abrasion resistance of the coating film 33 can be improved as compared with the case where the lamination is not repeated.

The first layer L1 contains a nitride, a carbide, a carbonitride, or an oxide of a first material having an elemental composition represented by $(Cr_{1-a-b-c}Al_a[Ni_{1-d}Zr_d]_bX_c)$. In the above composition formula, Cr is chromium, Al is aluminum, Ni is nickel, and Zr is zirconium. $[Ni_{1-d}Zr_d]$ is a ZrNi compound. X is at least one element selected from Ti (titanium), Nb (niobium), Si (silicon), B (boron), W (tungsten), and V (vanadium).

a, b, and c represent the atomic concentrations (at %) of Al, [NiZr], and X in $(Cr_{1-a-b-c}Al_a[Ni_{1-d}Zr_d]_bX_c)$, respectively. a satisfies 0.5≤a≤0.8. b satisfies 0.01≤b≤0.35. c satisfies 0≤c≤0.2. d represents the atomic concentration of Zr in $[Ni_{1-d}Zr_d]$. d satisfies 0.2≤d≤0.5. By setting the atomic concentrations of Al, [NiZr], and X within such numerical ranges, the first layer L1 can be a layer having high abrasion resistance. It is more desirable that a, b, and c satisfy 0.51≤a+b+c<1.

It is desirable that the first layer L1 be substantially composed only of a nitride, a carbide, a carbonitride, or an oxide of the first material. However, the first layer L1 may contain a nitride, a carbide, a carbonitride, or an oxide of the first material and impurities inevitably mixed.

The second layer L2 contains a nitride, a carbide, a carbonitride, or an oxide of the second material having an elemental composition represented by $(Al_cCr_{1-e-f}Z_f)$. In the above composition formula, Al is aluminum, and Cr is chromium. Z is at least one element selected from Si (silicon), Y (yttrium), and B (boron). e and f represent the atomic concentrations (at %) of Al and Z in $(Al_cCr_{1-e-f}Z_f)$, respectively. e satisfies 0.5≤e≤0.8. f satisfies 0.03≤f≤0.3. e and f satisfy e+f≤0.9. By setting the atomic concentrations of Al and Z within such a numerical range, the second layer L2 can be a layer having high abrasion resistance. As described above, Si (silicon) or Y (yttrium) can be selected as Z. By selecting Si (silicon) or Y (yttrium), the abrasion resistance of the coating film 33 including the second layer L2 can be improved.

The second layer L2 is desirably substantially composed only of a nitride, a carbide, a carbonitride, or an oxide of the second material. However, the second layer L2 may contain a nitride, a carbide, a carbonitride, or an oxide of the second material and impurities inevitably mixed.

The coating film 33 of the first embodiment is formed by alternately and repeatedly forming the first layer L1 and the second layer L2 on the surface of the base material 32. As a film forming method, for example, an ion plating method which is a type of physical vapor deposition (PVD) is used. Specifically, in the chamber, the base material 32 is disposed at the center, and a first target formed of the first material and a second target formed of the second material are disposed around the base material. Then, vapor deposition of the first material from the first target and vapor deposition of the second material from the second target are performed while rotating the base material 32. As a result, the first layer L1 and the second layer L2 are alternately and repeatedly deposited on the surface of the base material 32.

At this time, when nitrogen (N2) gas as a nitriding source is introduced into the chamber, the first material and the second material become nitrides and are deposited on the surface of the base material 32. When methane (CH4) gas as a carbonization source is introduced into the chamber, the first material and the second material become carbides, and are deposited on the surface of the base material 32. In addition, when nitrogen (N2) gas as a nitriding source and methane (CH4) gas as a carbonization source are introduced into the chamber, the first material and the second material become carbonitrides, and are deposited on the surface of the base material 32. When oxygen (O2) gas as an oxidation source is introduced into the chamber, the first material and the second material become oxides, and are deposited on the surface of the base material 32.

As described above, both the first layer L1 and the second layer L2 have excellent abrasion resistance. However, the hardness of the first layer L1 is relatively lower than that of the second layer L2. By sandwiching the first layer L1 between the second layers L2, a buffering action by the first layer L1 is obtained, and the toughness of the coating film 33 is improved. Therefore, minute cracks are less likely to occur on the surface of the coating film 33 than in a case where the coating film includes only the first layer L1 or only the second layer L2. As a result, the abrasion resistance of the coating film 33 is improved, and the life of the tool 30 can be prolonged.

The thickness h of the lamination unit 61 constituted by the first layer L1 and the second layer L2 is desirably 200 nm or less. By suppressing the thickness h of the lamination unit 61 to 200 nm or less, the lamination unit 61 can be repeatedly stacked in the coating film 33 many times. Accordingly, the abrasion resistance of the coating film 33 can be further improved.

In the example of FIG. 5, the lowermost layer of the coating film 33 is the first layer L1, and the uppermost layer is the second layer L2. However, the lowermost layer of the coating film 33 may be the second layer L2. The uppermost layer of the coating film 33 may be the first layer L1.

Figure 6:
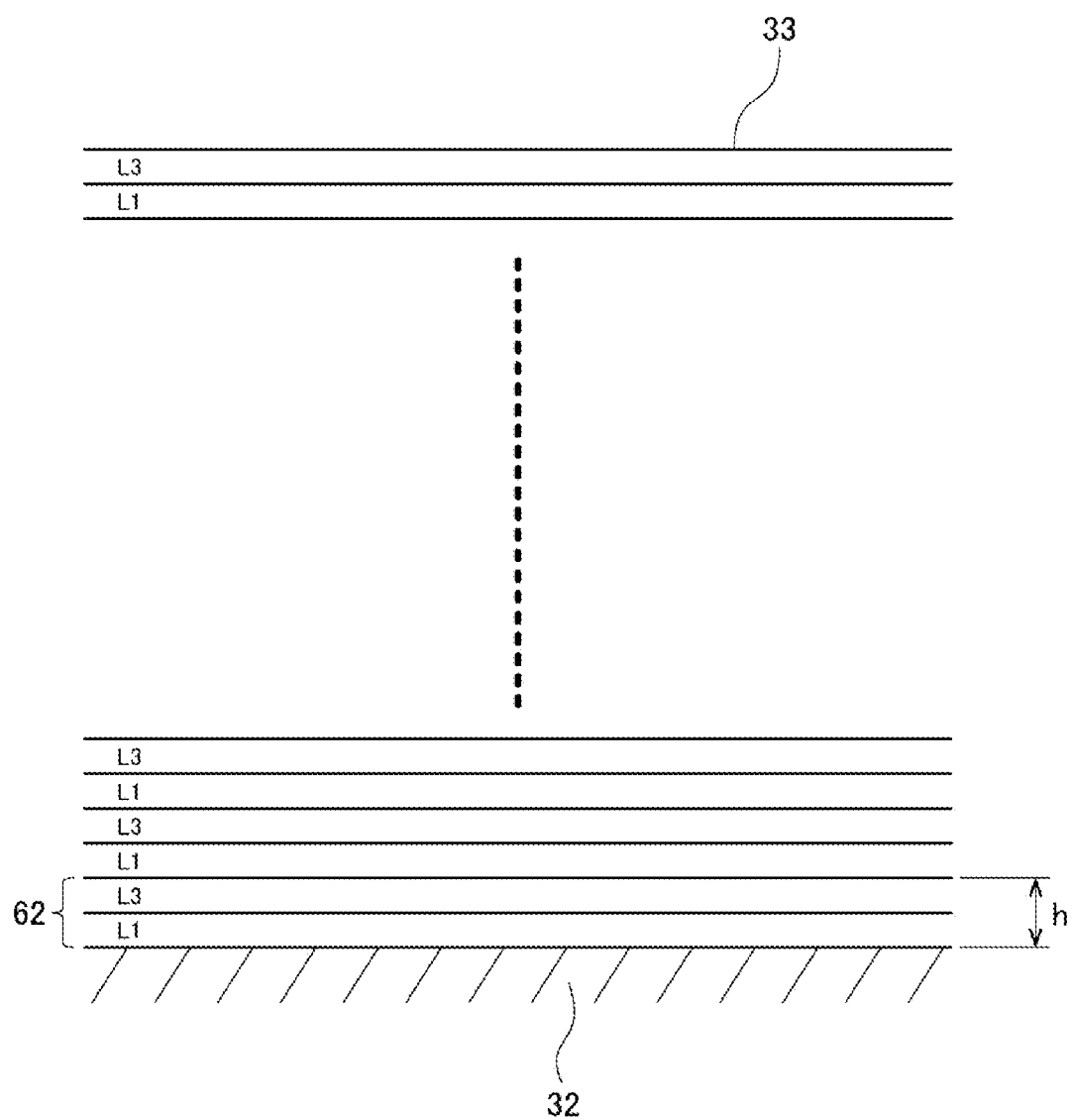
FIG. 6 is a diagram schematically illustrating a layer structure of a coating film according to a second embodiment.

FIG. 6 is a diagram schematically illustrating a layer structure of the coating film 33 according to the second embodiment. As illustrated in FIG. 6, the coating film 33 of the second embodiment is a multilayer film in which a plurality of lamination units 62 constituted by the first layer L1 and the third layer L3 are stacked. The thickness of the coating film 33 is, for example, about 1 μm to 5 μm. As described later, by repeatedly laminating the lamination unit 62 a plurality of times, the abrasion resistance of the coating film 33 can be improved as compared with the case where the lamination is not repeated.

The first layer L1 contains a nitride, a carbide, a carbonitride, or an oxide of the first material having the same elemental composition as that of the first embodiment described above. It is desirable that the first layer L1 be substantially composed only of a nitride, a carbide, a carbonitride, or an oxide of the first material. However, the first layer L1 may contain a nitride, a carbide, a carbonitride, or an oxide of the first material and impurities inevitably mixed.

The third layer L3 includes a nitride, a carbide, a carbonitride, or an oxide of the third material having an elemental composition represented by $(Al_gCr_{1-g})$. In the above composition formula, Al is aluminum, and Cr is chromium. g represents the atomic concentration (at %) of Al in $(Al_gCr_{1-g})$. g satisfies $0.5 \leq g \leq 0.8$. By setting the atomic concentration of Al within such a numerical range, the third layer L3 can be a layer having high abrasion resistance.

It is desirable that the third layer L3 be substantially made only of a nitride, a carbide, a carbonitride, or an oxide of the third material. However, the third layer L3 may contain a nitride, a carbide, a carbonitride, or an oxide of the third material and impurities inevitably mixed.

The coating film 33 of the second embodiment is formed by alternately and repeatedly forming the first layer L1 and the third layer L3 on the surface of the base material 32. As a film forming method, for example, an ion plating method which is a type of physical vapor deposition (PVD) is used. Specifically, in the chamber, the base material 32 is disposed at the center, and the first target formed of the first material and the third target formed of the third material are disposed around the base material. Then, vapor deposition of the first material from the first target and vapor deposition of the third material from the third target are performed while rotating the base material 32. As a result, the first layer L1 and the third layer L3 are alternately and repeatedly deposited on the surface of the base material 32.

At this time, when nitrogen (N2) gas as a nitriding source is introduced into the chamber, the first material and the third material become nitrides and are deposited on the surface of the base material 32. When a methane (CH4) gas as a carbonization source is introduced into the chamber, the first material and the third material become carbides, and are deposited on the surface of the base material 32. In addition, when nitrogen (N2) gas as a nitriding source and methane (CH4) gas as a carbonization source are introduced into the chamber, the first material and the third material become carbonitrides, and are deposited on the surface of the base material 32. When oxygen (O2) gas as an oxidation source is introduced into the chamber, the first material and the third material become oxides, and are deposited on the surface of the base material 32.

As described above, both the first layer L1 and the third layer L3 have excellent abrasion resistance. However, the hardness of the first layer L1 is relatively lower than that of the third layer L3. By sandwiching the first layer L1 between the third layers L3, a buffering action by the first layer L1 is obtained, and the toughness of the coating film 33 is improved. Therefore, minute cracks are less likely to occur on the surface of the coating film 33 than in a case where the coating film includes only the first layer L1 or only the third layer L3. As a result, the abrasion resistance of the coating film 33 is improved, and the life of the tool 30 can be prolonged.

The thickness h of the lamination unit 62 constituted by the first layer L1 and the third layer L3 is desirably 200 nm or less. By suppressing the thickness h of the lamination unit 62 to 200 nm or less, the lamination unit 62 can be repeatedly stacked in the coating film 33 many times. Accordingly, the abrasion resistance of the coating film 33 can be further improved.

In the example of FIG. 6, the lowermost layer of the coating film 33 is the first layer L1, and the uppermost layer is the third layer L3. However, the lowermost layer of the coating film 33 may be the third layer L3. The uppermost layer of the coating film 33 may be the first layer L1.

Figure 7:
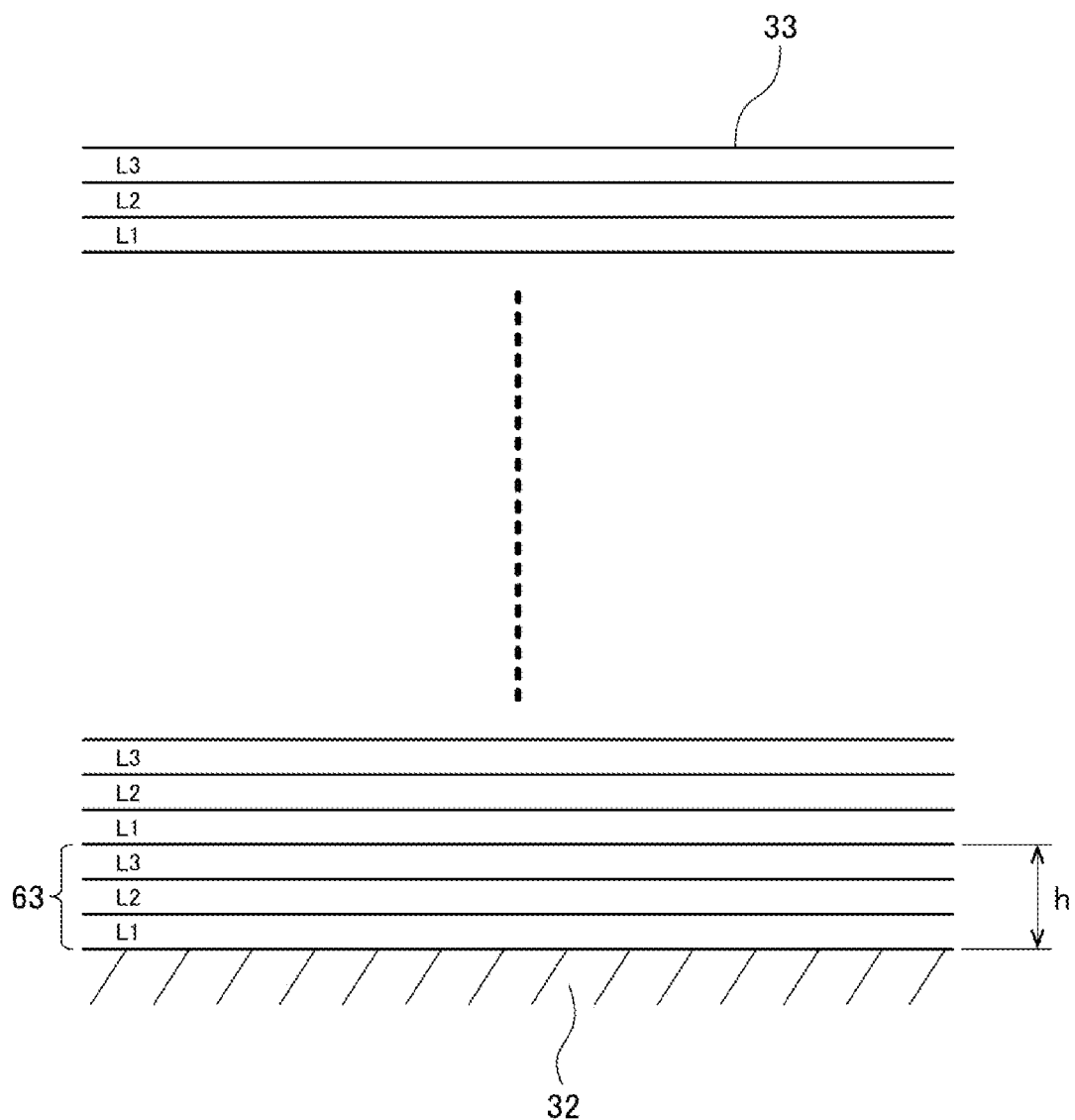
FIG. 7 is a diagram schematically illustrating a layer structure of a coating film according to a third embodiment.

FIG. 7 is a diagram schematically illustrating a layer structure of the coating film 33 according to the third embodiment. As illustrated in FIG. 7, the coating film 33 of the third embodiment is a multilayer film in which a plurality of lamination units 63 including a first layer L1, a second layer L2, and a third layer L3 are stacked. The thickness of the coating film 33 is, for example, about 1 μm to 5 μm. As described later, by repeatedly laminating the lamination unit 63 a plurality of times, the abrasion resistance of the coating film 33 can be improved as compared with the case where the lamination is not repeated.

The first layer L1 contains a nitride, a carbide, a carbonitride, or an oxide of the first material having the same elemental composition as that of the first embodiment described above. It is desirable that the first layer L1 be substantially composed only of a nitride, a carbide, a carbonitride, or an oxide of the first material. However, the first layer L1 may contain a nitride, a carbide, a carbonitride, or an oxide of the first material and impurities inevitably mixed.

The second layer L2 contains a nitride, a carbide, a carbonitride, or an oxide of the second material having the same elemental composition as that of the first embodiment described above. The second layer L2 is desirably substantially composed only of a nitride, a carbide, a carbonitride, or an oxide of the second material. However, the second layer L2 may contain a nitride, a carbide, a carbonitride, or an oxide of the second material and impurities inevitably mixed.

The third layer L3 includes a nitride, a carbide, a carbonitride, or an oxide of the third material having the same elemental composition as that of the second embodiment described above. It is desirable that the third layer L3 be substantially made only of a nitride, a carbide, a carbonitride, or an oxide of the third material. However, the third layer L3 may contain a nitride, a carbide, a carbonitride, or an oxide of the third material and impurities inevitably mixed.

The coating film 33 of the third embodiment is formed by repeatedly forming the first layer L1, the second layer L2, and the third layer L3 on the surface of the base material 32. As a film forming method, for example, an ion plating method which is a type of physical vapor deposition (PVD) is used. Specifically, in the chamber, the base material 32 is disposed at the center, and the first target formed of the first material, the second target formed of the second material, and the third target formed of the third material are disposed around the base material. Then, while rotating the base material 32, vapor deposition of the first material from the first target, vapor deposition of the second material from the second target, and vapor deposition of the third material from the third target are performed. As a result, the first layer L1, the second layer L2, and the third layer L3 are repeatedly formed on the surface of the base material 32.

At this time, when nitrogen (N2) gas as a nitriding source is introduced into the chamber, the first material, the second material, and the third material become nitrides and are deposited on the surface of the base material 32. When methane (CH4) gas as a carbonization source is introduced into the chamber, the first material, the second material, and the third material become carbides, and are deposited on the surface of the base material 32. When nitrogen (N2) gas as a nitriding source and methane (CH4) gas as a carbonization source are introduced into the chamber, the first material, the second material, and the third material become carbonitrides, and are deposited on the surface of the base material 32. When oxygen (O2) gas as an oxidation source is introduced into the chamber, the first material, the second material, and the third material become oxides, and are deposited on the surface of the base material 32.

As described above, each of the first layer L1, the second layer L2, and the third layer L3 has excellent abrasion resistance. However, the first layer L1 has relatively lower hardness than the second layer L2 and the third layer L3. By sandwiching such a first layer L1 between the second layer L2 and the third layer L3, a buffering action by the first layer L1 is obtained, and the toughness of the coating film 33 is improved. Therefore, minute cracks are less likely to occur on the surface of the coating film 33 than in a case where the coating film includes only the first layer L1, only the second layer L2, or only the third layer L3. As a result, the abrasion resistance of the coating film 33 is improved, and the life of the tool 30 can be prolonged.

The thickness h of the lamination unit 63 including the first layer L1, the second layer L2, and the third layer L3 is desirably 200 nm or less. By suppressing the thickness h of the lamination unit 63 to 200 nm or less, the lamination unit 63 can be repeatedly stacked in the coating film 33 many times. Accordingly, the abrasion resistance of the coating film 33 can be further improved.

In the example of FIG. 7, the lowermost layer of the coating film 33 is the first layer L1, and the uppermost layer is the third layer L3. However, the lowermost layer of the coating film 33 may be the second layer L2 or the third layer L3. The uppermost layer of the coating film 33 may be the first layer L1 or the second layer L2.

In addition, the stacking order of the first layer L1, the second layer L2, and the third layer L3 is not limited to the example of FIG. 7. For example, the stacking order of the second layer L2 and the third layer L3 may be opposite to that in the example of FIG. 7.

Figure 8:
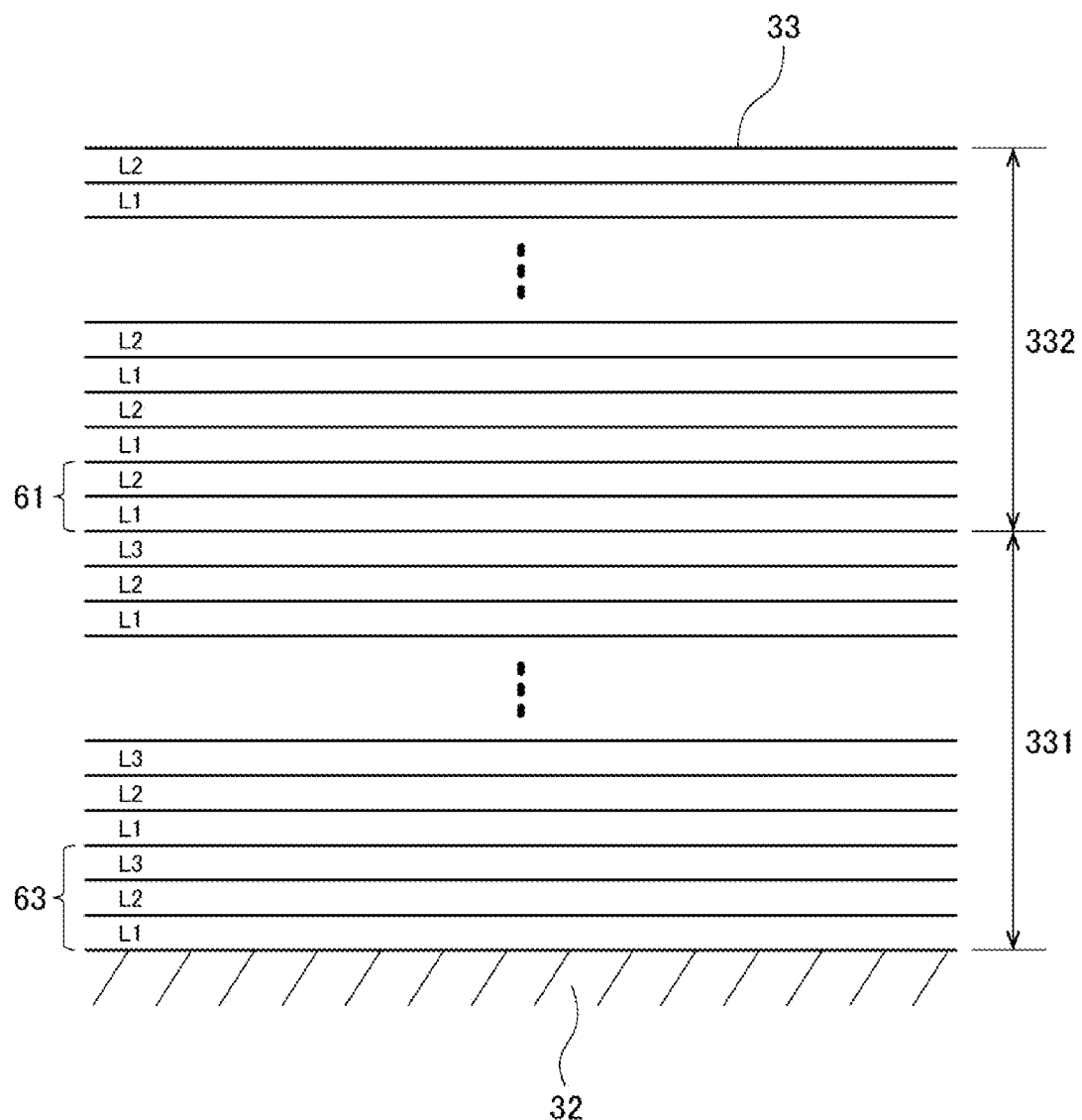
FIG. 8 is a diagram schematically illustrating a layer structure of a coating film according to a fourth embodiment.

FIG. 8 is a diagram schematically illustrating a layer structure of the coating film 33 according to the fourth embodiment. As illustrated in FIG. 8, the coating film 33 of the fourth embodiment is a multilayer film having a lower layer portion 331 and an upper layer portion 332. The thickness of the coating film 33 is, for example, about 1 μm to 5 μm. In the lower layer portion 331, a plurality of lamination units 63 including the first layer L1, the second layer L2, and the third layer L3 are stacked. In the upper layer portion 332, a plurality of lamination units 61 including the first layer L1 and the second layer L2 are stacked. As described later, by repeatedly laminating the lamination unit 61 and the lamination unit 63 a plurality of times, the abrasion resistance of the coating film 33 can be improved as compared with the case where the lamination is not repeated.

The first layer L1 contains a nitride, a carbide, a carbonitride, or an oxide of the first material having the same elemental composition as that of the first embodiment described above. It is desirable that the first layer L1 be substantially composed only of a nitride, a carbide, a carbonitride, or an oxide of the first material. However, the first layer L1 may contain a nitride, a carbide, a carbonitride, or an oxide of the first material and impurities inevitably mixed.

The second layer L2 contains a nitride, a carbide, a carbonitride, or an oxide of the second material having the same elemental composition as that of the first embodiment described above. The second layer L2 is desirably substantially composed only of a nitride, a carbide, a carbonitride, or an oxide of the second material. However, the second layer L2 may contain a nitride, a carbide, a carbonitride, or an oxide of the second material and impurities inevitably mixed.

The third layer L3 includes a nitride, a carbide, a carbonitride, or an oxide of the third material having the same elemental composition as that of the second embodiment described above. It is desirable that the third layer L3 be substantially made only of a nitride, a carbide, a carbonitride, or an oxide of the third material. However, the third layer L3 may contain a nitride, a carbide, a carbonitride, or an oxide of the third material and impurities inevitably mixed.

The coating film 33 of the fourth embodiment is formed by first forming the lower layer portion 331 on the surface of the base material 32 and then forming the upper layer portion 332. At the time of film formation of the lower layer portion 331, the first layer L1, the second layer L2, and the third layer L3 are repeatedly formed. A specific film forming method is the same as that of the third embodiment described above. At the time of film formation of the upper layer portion 332, the first layer L1 and the second layer L2 are repeatedly formed. A specific film forming method is the same as that of the first embodiment described above.

When nitrogen (N2) gas as a nitriding source is introduced into the chamber at the time of performing the film formation, the first material, the second material, and the third material become nitrides and are deposited on the surface of the base material 32. When methane (CH4) gas as a carbonization source is introduced into the chamber, the first material, the second material, and the third material become carbides, and are deposited on the surface of the base material 32. When nitrogen (N2) gas as a nitriding source and methane (CH4) gas as a carbonization source are introduced into the chamber, the first material, the second material, and the third material become carbonitrides, and are deposited on the surface of the base material 32. When oxygen (O2) gas as an oxidation source is introduced into the chamber, the first material, the second material, and the third material become oxides, and are deposited on the surface of the base material 32.

As described above, each of the first layer L1, the second layer L2, and the third layer L3 has excellent abrasion resistance. However, the first layer L1 has relatively lower hardness than the second layer L2 and the third layer L3. In the lower layer portion 331, such a first layer L1 is sandwiched between the second layer L2 and the third layer L3. As a result, the toughness of the lower layer portion 331 is improved. In the upper layer portion 332, such a first layer L1 is sandwiched between the second layers L2. As a result, the toughness of the upper layer portion 332 is improved. Therefore, minute cracks are less likely to occur on the surface of the coating film 33 than in a case where the coating film includes only the first layer L1, only the second layer L2, or only the third layer L3. As a result, the abrasion resistance of the coating film 33 is improved, and the life of the tool 30 can be prolonged.

The thickness of the lamination unit 63 including the first layer L1, the second layer L2, and the third layer L3 is desirably 200 nm or less. By suppressing the thickness of the lamination unit 63 to 200 nm or less, the lamination unit 63 can be repeatedly stacked many times in the lower layer portion 331. Accordingly, the abrasion resistance of the coating film 33 can be further improved.

In addition, the thickness of the lamination unit 61 constituted by the first layer L1 and the second layer L2 is also desirably 200 nm or less. By suppressing the thickness of the lamination unit 61 to 200 nm or less, the lamination unit 61 can be repeatedly stacked many times in the upper layer portion 332. Accordingly, the abrasion resistance of the coating film 33 can be further improved.

In the example of FIG. 8, the lowermost layer of the lower layer portion 331 is the first layer L1, and the uppermost layer is the third layer L3. However, the lowermost layer of the coating film 33 may be the second layer L2 or the third layer L3. The uppermost layer of the coating film 33 may be the first layer L1 or the second layer L2. In addition, the stacking order of the first layer L1, the second layer L2, and the third layer L3 in the lower layer portion 331 is not limited to the example of FIG. 8. For example, the stacking order of the second layer L2 and the third layer L3 may be opposite to that in the example of FIG. 8.

In the example of FIG. 8, the lowermost layer of the upper layer portion 332 is the first layer L1, and the uppermost layer is the second layer L2. However, the lowermost layer of the upper layer portion 332 may be the second layer L2. The uppermost layer of the upper layer portion 332 may be the first layer L1.

Figure 9:
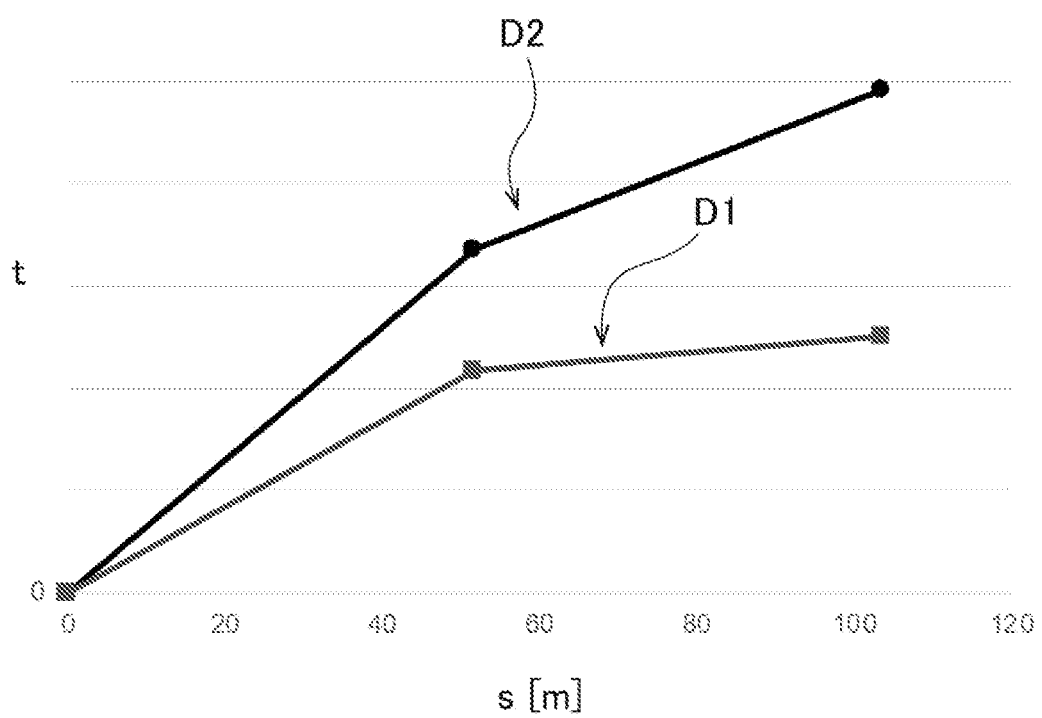
FIG. 9 is a graph illustrating results of an experiment for examining abrasion resistance performance of a coating film.

FIG. 9 is a graph illustrating the results of an experiment for examining the abrasion resistance performance of the coating film 33. The graph of FIG. 9 includes first data D1 indicating the example and second data D2 indicating the comparative example. In examples, a tool has been used in which a coating film including a lower layer portion and an upper layer portion similar to those in the fourth embodiment have been formed on the surface of the base material 32. In the comparative example, a tool in which a conventional Al—Cr—N-based monolayer film has been formed on the surface of the same substrate as in the example has been used. The thickness of the coating film has been the same in examples and comparative examples. The type of tool has been a hob cutter.

FIG. 9 is a graph illustrating the result of examining the relationship between a total cutting length s of a large number of parts cut using the tools of examples and comparative examples and a depth t of wear generated on the surface of the tool. Referring to the result of FIG. 9, in the first data D1 indicating the example, the depth t of wear generated on the surface of the tool is reduced by nearly 50% as compared with the second data D2 indicating the comparative example. From this result, it can be seen that the abrasion resistance of the coating film of the tool of the example is significantly improved as compared with the tool of the comparative example.

The coating film 33 of the tool 30 of each of the above embodiments has a lamination unit including the first layer L1 and at least one of the second layer L2 and the third layer L3. The compositions of the first layer L1, the second layer L2, and the third layer L3 are as described above. By laminating the plurality of layers in this manner, the toughness of the coating film 33 is improved. As a result, the abrasion resistance of the coating film 33 can be improved as compared with a case where a coating film having the same thickness is formed only with one of the first layer L1, the second layer L2, and the third layer L3.

For example, in a case where the coating film 33 is formed only of the second layer L2, when an extremely small crack occurs in the second layer L2, the crack may progress in the thickness direction of the coating film 33 to become a large crack. On the other hand, for example, when the coating film 33 is formed of the first layer L1 and the second layer L2, a plurality of layers having different hardness is stacked. In this case, since the hardness of the first layer L1 is lower than the hardness of the second layer L2, it is possible to suppress an extremely small crack generated in the second layer L2 from proceeding in the thickness direction of the coating film 33 beyond the boundary between the second layer L2 and the first layer L1. Therefore, large cracks in the thickness direction are less likely to occur in the coating film 33. That is, as compared with the case where the coating film 33 is formed only of the second layer L2, the possibility of generating a crack larger than the thickness of the second layer L2 can be reduced. As a result, the abrasion resistance of the coating film 33 can be improved.

In particular, the coating film 33 of each of the above embodiments is a multilayer film in which a plurality of lamination units including the first layer L1 and at least one of the second layer L2 and the third layer L3 are stacked. As described above, by repeatedly laminating the lamination unit a plurality of times, the abrasion resistance of the coating film 33 can be improved as compared with the case where the lamination is not repeated.

In the coating film 33 of each of the above embodiments, the thickness h of the lamination unit is 200 nm or less. As described above, by suppressing the thickness of one lamination unit, the lamination unit can be repeatedly stacked in the coating film 33 many times. Accordingly, the abrasion resistance of the coating film 33 can be further improved.

As described above, each of the first layer L1, the second layer L2, and the third layer L3 may be any of a nitride, a carbide, a carbonitride, and an oxide. However, if the first layer L1 is a nitride of the first material, the second layer L2 is a nitride of the second material, and the third layer L3 is a nitride of the third material, the abrasion resistance of the coating film 33 can be further improved as compared with the case of carbide, carbonitride, or oxide.

The tool 30 includes the base material 32 and the coating film 33 formed on the surface of the base material 32. As described above, the coating film 33 has extremely high abrasion resistance by having a lamination unit including the first layer L1 and at least one of the second layer L2 and the third layer L3. As a result, the life of the tool 30 can be improved as compared with the case of having a single-coating film coating formed of a single material.

While an exemplary embodiment of the present disclosure has been described above, the present disclosure is not limited to the above embodiment.

In the above-described embodiment, the above-described lamination unit is directly deposited on the surface of the base material 32. However, the above-described lamination unit may be formed on the surface of the base material 32 via another layer. For example, a single layer portion including only the third layer L3 may be formed on the surface of the base material 32, and the above-described lamination unit may be stacked on the surface of the single layer portion.

Figure 10:
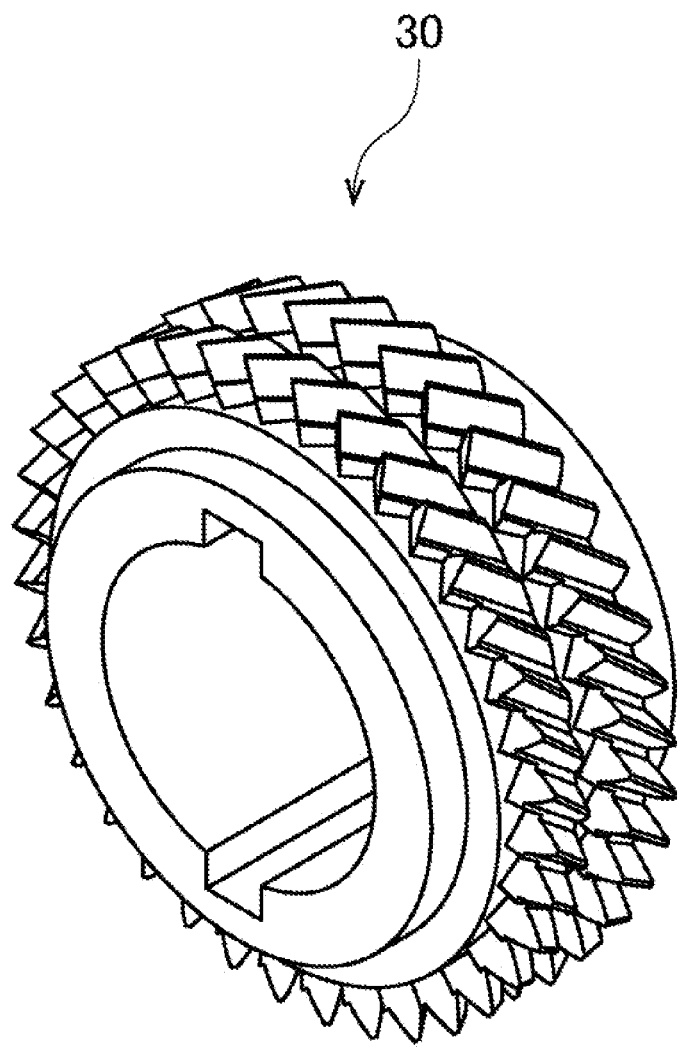
FIG. 10 is a perspective view of the tool.

Further, in the above embodiment, the case where the tool 30 is a hob cutter for cutting the external teeth of the gear has been described. However, the application target of the coating film 33 is not limited to the hob cutter. FIG. 10 is a perspective view of a skiving cutter as another example of the tool 30. The skiving cutter is a tool 30 for cutting internal teeth of a gear. The coating film 33 similar to that in each of the above embodiments may be formed on the surface of such a skiving cutter. The tool 30 to which the coating film 33 is applied may be a pinion cutter, a shaving cutter, or the like.

It is desirable that the tool 30 be any one of the above-described hob cutter, pinion cutter, skiving cutter, and shaving cutter. Since these cutting tools cut a metal part, the coating film on the surface is required to have very high hardness. However, since a material having high hardness has low toughness, there is a problem that cracks are likely to occur. In general, it is difficult to achieve both hardness and toughness with a single material.

In this respect, the coating film 33 of each of the above embodiments is formed by laminating at least one of the second layer L2 and the third layer L3 having high hardness and the first layer L1 having hardness relatively lower than that of the second layer L2 and the third layer L3. As a result, a buffering action by the first layer L1 is obtained, and the toughness of the coating film 33 is improved. Therefore, cracks are less likely to occur in the coating film 33 than when the coating film is formed of a single material. That is, by forming the coating film 33 into a multilayer structure of a plurality of materials, it is possible to achieve both hardness and toughness required for a tool. In addition, even if a minute crack occurs in the second layer L2 or the third layer L3 in the vicinity of the surface of the coating film 33, the first layer L1 under the second layer L2 or the third layer L3 has high toughness, so that the crack hardly proceeds in the depth direction. As a result, the abrasion resistance of the coating film 33 is improved, and the life of the tool 30 can be prolonged.

The present application can be applied to, for example, a coating film, a tool, and a machine tool.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A coating film, comprising a lamination unit including a first layer and at least one of a second layer and a third layer, wherein
   the first layer contains a nitride, a carbide, a carbonitride, or an oxide of a first material of which elemental composition is represented by $(Cr_{1-a-b-c}Al_a[Ni_{1-d}Zr_d]_b X_c)$,
   as features of the first layer,
   the $[Ni_{1-d}Zr_d]$ is a ZrNi compound,
   the X is at least one element selected from Ti, Nb, Si, B, W, and V,
   the a, b, and c respectively represent atomic concentrations of Al, [NiZr], and X in the $(Cr_{1-a-b-c}Al_a[Ni_{1-d}Zr_d]_b X_c)$, and satisfy $0.5 \le a \le 0.8$, $0.01 \le b \le 0.35$, and $0 < c \le 0.2$,
   the d represents an atomic concentration of Zr in the $[Ni_{1-d}Zr_d]$, and satisfies $0.2 \le d \le 0.5$,
   the second layer contains a nitride, a carbide, a carbonitride, or an oxide of a second material of which elemental composition is represented by $(Al_e Cr_{1-e-f} Z_f)$,
   the Z is at least one element selected from Si, Y, and B, the e and f represent atom concentrations of Al and Z in the $(Al_eCr_{1-e-f}Z_f)$, respectively, and satisfy $0.5 \leq e \leq 0.8$, $0.03 \leq f \leq 0.3$, $e+f \leq 0.9$, the third layer contains a nitride, a carbide, a carbonitride, or an oxide of a third material of which elemental composition is represented by $(Al_gCr_{1-g})$, and the g represents an atomic concentration of Al in the $(Al_gCr_{1-g})$, and satisfies $0.5 \leq g \leq 0.8$.

2. The coating film according to claim 1, wherein a plurality of the laminating units are stacked.

3. The coating film according to claim 2, wherein a thickness of the lamination unit is 200 nm or less.

4. The coating film according to claim 2, wherein a plurality of lamination units including the first layer and the second layer are stacked.

5. The coating film according to claim 2, wherein a plurality of lamination units including the first layer and the third layer are stacked.

6. The coating film according to claim 2, wherein a plurality of lamination units including the first layer, the second layer, and the third layer are stacked.

7. The coating film according to claim 2, comprising:
a lower layer portion in which a plurality of lamination units including the first layer, the second layer, and the third layer are stacked; and
an upper layer portion in which a plurality of lamination units including the first layer and the second layer are stacked.

8. The coating film according to claim 1, wherein the Z is Si or Y.

9. The coating film according to claim 1, wherein
the first layer is the nitride of the first material,
the second layer is the nitride of the second material, and
the third layer is the nitride of the third material.

10. A tool, comprising:
a base material; and
the coating film according to claim 1 formed on a surface of the base material.

11. The tool according to claim 10, wherein the tool is any one of a hob cutter, a pinion cutter, a skiving cutter, and a shaving cutter.

12. A machine tool, comprising:
a part holder; and
the tool according to claim 11 that machines a part held by the part holder.

* * * * *